United States Patent
Satoh

(10) Patent No.: US 6,245,642 B1
(45) Date of Patent: Jun. 12, 2001

(54) PROCESS FOR PLANARIZING BURIED OXIDE FILMS IN TRENCHES BY APPLYING SEQUENTIAL DIVERSE CMP TREATMENTS

(75) Inventor: Yuji Satoh, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/501,573

(22) Filed: Feb. 10, 2000

(30) Foreign Application Priority Data

Mar. 24, 1999 (JP) ................................................. 11-078766

(51) Int. Cl.⁷ .................................................. H01L 21/76
(52) U.S. Cl. .......................... 438/427; 438/437; 438/693; 438/703
(58) Field of Search .................................. 438/437, 424, 438/427, 400, 692, 703, 296, 693

(56) References Cited

U.S. PATENT DOCUMENTS

| | | | |
|---|---|---|---|
| 5,663,107 | * 9/1997 | Peschke et al. | 438/692 |
| 5,665,202 | * 9/1997 | Subramanian et al. | 438/692 |
| 5,721,172 | * 2/1998 | Jang et al. | 438/424 |
| 5,750,433 | * 5/1998 | Jo | 438/424 |
| 5,817,567 | * 10/1998 | Jang et al. | 438/427 |
| 5,958,795 | * 9/1999 | Chen et al. | 438/692 |
| 6,001,740 | * 12/1999 | Varian et al. | 438/692 |
| 6,048,771 | * 4/2000 | Lin et al. | 438/296 |
| 6,071,792 | * 6/2000 | Kim et al. | 438/424 |
| 6,146,975 | * 11/2000 | Kuchne et al. | 438/437 |

FOREIGN PATENT DOCUMENTS 9-153543   8/1997   (JP).

* cited by examiner

Primary Examiner—Olik Chaudhuri
Assistant Examiner—Kurt Eaton
(74) Attorney, Agent, or Firm—Nixon & Vanderhye, P.C.

(57) ABSTRACT

The present invention provides a process for manufacturing a semiconductor structure comprising the steps of: (a) forming a first SiN film on a semiconductor substrate; (b) patterning the first SiN film, etching the resulting substrate using the first SiN film as a mask to form a plurality of first trenches and at least one second trench, so as to form a first islands group and at least one second island-like region; (c) depositing a $SiO_2$ film to fill the first and second trenches with the $SiO_2$ film; (d) forming a second SiN film over the resulting surface; (e) polishing the second SiN film and the $SiO_2$ film by a CMP method using a first slurry until the surface of the first SiN film on the second island-like region is exposed; (f) polishing the second SiN film and the $SiO_2$ film by a CMP method using a second slurry until the surface of the first SiN film on the first island-like region is exposed; (g) etching a predetermined amount of the $SiO_2$ film; and (h) removing the second and first SiN films.

5 Claims, 5 Drawing Sheets

FiG. 2 (a) (Prior Art)
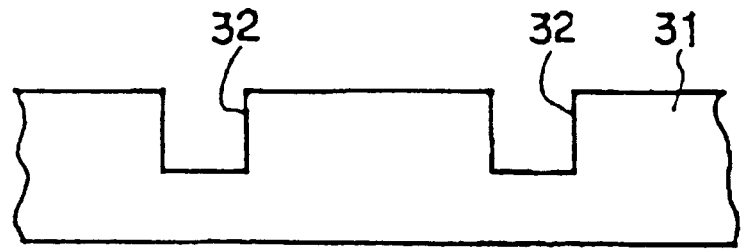
FiG. 2 (b) (Prior Art)
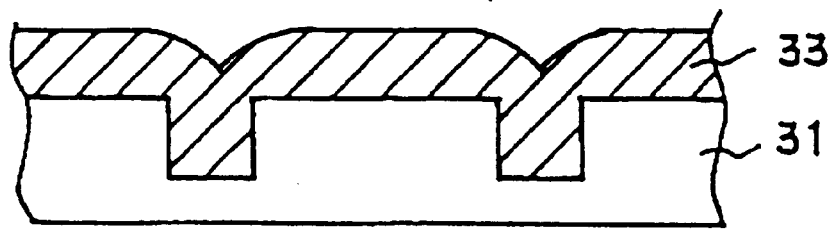
FiG. 2 (c) (Prior Art)
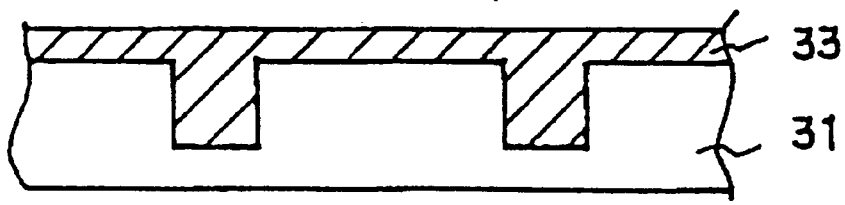
FiG. 2 (d) (Prior Art)
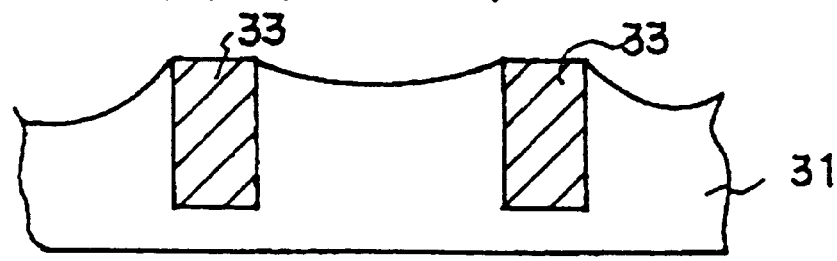
FiG. 2 (e) (Prior Art)
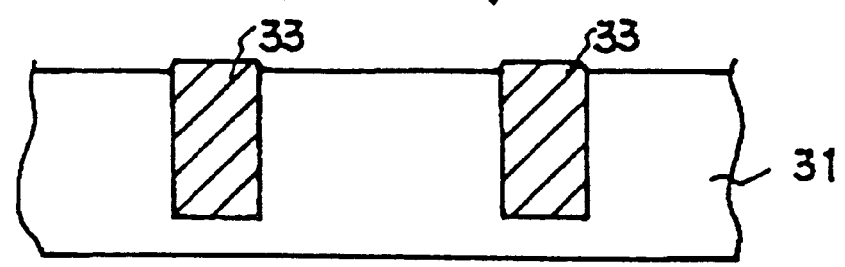

PROCESS FOR PLANARIZING BURIED OXIDE FILMS IN TRENCHES BY APPLYING SEQUENTIAL DIVERSE CMP TREATMENTS

CROSS-REFERENCE TO RELATED APPLICATION

This application is related to Japanese application No. HEI 11(1999)-078766 filed on Dec. 24, 1999, whose priority is claimed under 35 USC § 119, the disclosure of which is incorporated by reference in its entirety.

BACKGROUND OF THE INVENTION

1. Field of the Invention

The present invention relates to a process for manufacturing a semiconductor structure. More particularly, the process includes formation of a trench region for device isolation.

2. Description of Related Art

One of methods for forming a trench device isolation region has been disclosed in Japanese Unexamined Patent Publication No. HEI 9(1997)-153543. This conventional art is explained with reference to FIG. 2.

First, a trench 32 is formed in a predetermined width and depth to a predetermined location on the surface of a silicon wafer 31 by use of a photolithography process (FIG. 2(a)). Next, the resulting surface of the silicon wafer 31 is covered with a silicon oxide film 33. This step is for filling the trench 32 with the silicon oxide film 33 and also covering the entire surface of the silicon wafer 31 with the silicon oxide film 33 of a predetermined thickness (FIG. 2(b)).

The surface of the silicon oxide film 33 is flattened (FIG. 2(c)) by chemical mechanical polishing using a slurry containing cerium oxide ($CeO_2$). Further, the flattened silicon oxide film is polished with use of an abrasive slurry containing fumed silica so as to expose the surface of the silicon wafer 31 (FIG. 2(d)). The ending of chemical mechanical polishing in this case can be judged from exposure of the surface of silicon wafer 31, which is hydrophobic.

Next, the surface of the silicon wafer is subjected to finishing polish with use of an abrasive slurry of silicon compound containing an amine. As a result, a silicon wafer can be obtained which has a trench-isolated structure having a flat silicon surface and an isolation region of a silicon oxide film with rounded corners, but no dishing (FIG. 2(e)).

Thus, in the case where the trench device isolation region embedded with the silicon oxide film is formed by the method of polishing with use of the cerium oxide-containing abrasive slurry and then polishing with use of the fumed silica-containing abrasive slurry, as disclosed by the above-mentioned Japanese Unexamined Patent Publication No. HEI 9(1997)-153543, fumed silica is used for polishing the silicon oxide film to expose the surface of silicon in an active region. However, since the fumed silica has a small selective ratio for a silicon wafer with respect to silicon oxide film, silicon of wafer cannot serve as a polish stopper. For this reason, the surface of silicon is over-polished, which results in a decrease in the depth of the trench.

SUMMARY OF THE INVENTION

The present invention provides a process for manufacturing a semiconductor structure comprising the steps of: (a) forming a first silicon nitride film on a semiconductor substrate; (b) patterning the first silicon nitride film into a predetermined configuration, etching the resulting semiconductor substrate using the first silicon nitride film as a mask to form a plurality of first trenches and at least one second trench, so as to form a first islands group and at least one second island-like region, the first islands group being composed of the plural first island-like regions located between the plural first trenches, and the second island-like region being adjacent to the first islands group with intervention of the second trench and being wider than the first island-like region; (c) depositing a silicon oxide film over the resulting surface to fill the first and second trenches with the silicon oxide film; (d) forming a second silicon nitride film over the resulting surface; (e) polishing the second silicon nitride film and the silicon oxide film by a CMP method using a first slurry until the surface of the first silicon nitride film on the second island-like region is exposed; (f) polishing the second silicon nitride film and the silicon oxide film by a CMP method using a second slurry until the surface of the first silicon nitride film on the first island-like region is exposed; (g) etching a predetermined amount of the silicon oxide film; and (h) removing the second silicon nitride film and the first silicon nitride film.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 2(a) to 2(e) are schematic sectional views of a major part of a semiconductor structure illustrating a conventional process for manufacturing the semiconductor structure.

DESCRIPTION OF THE PREFERRED EMBODIMENTS

Figure 1:
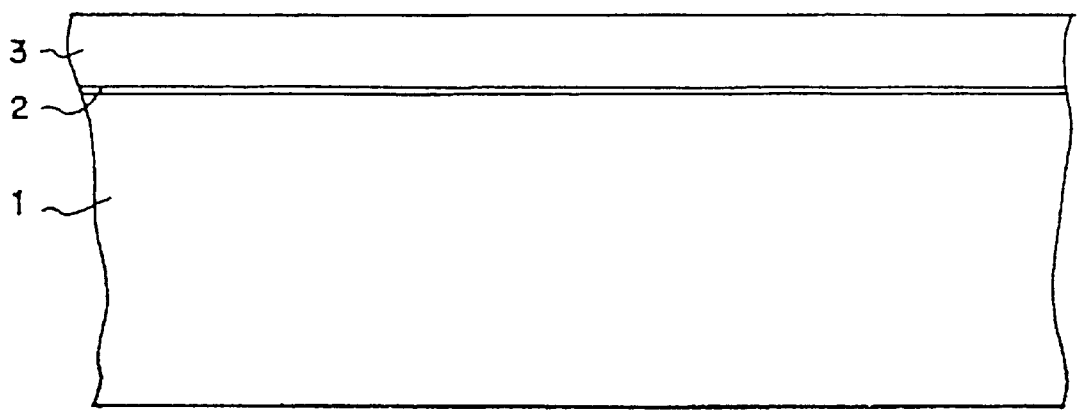
FIGS. 1(a) to 1(h) are schematic sectional views of a major part of a semiconductor structure illustrating a process for manufacturing the semiconductor structure in accordance with an embodiment of the present invention.
Figure 1:
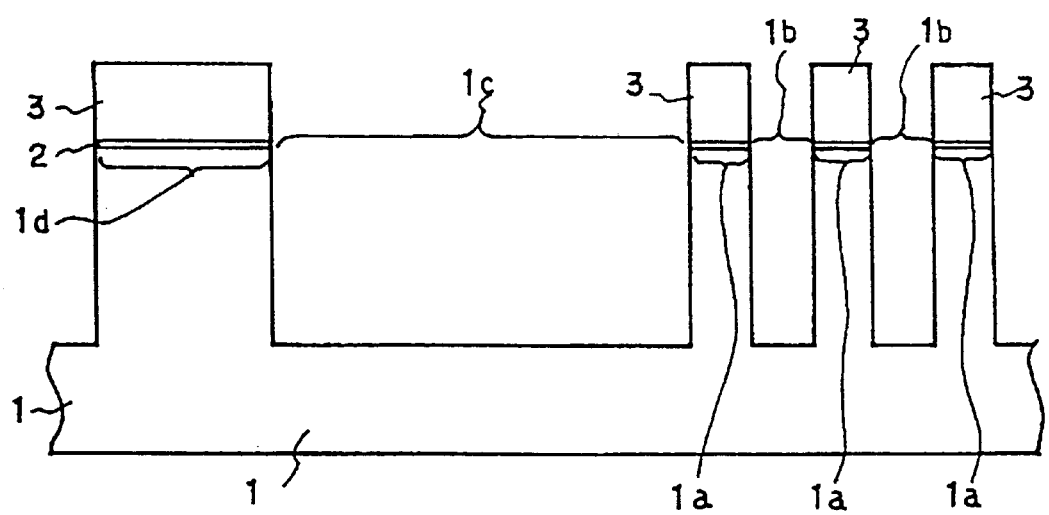
Figure 1:
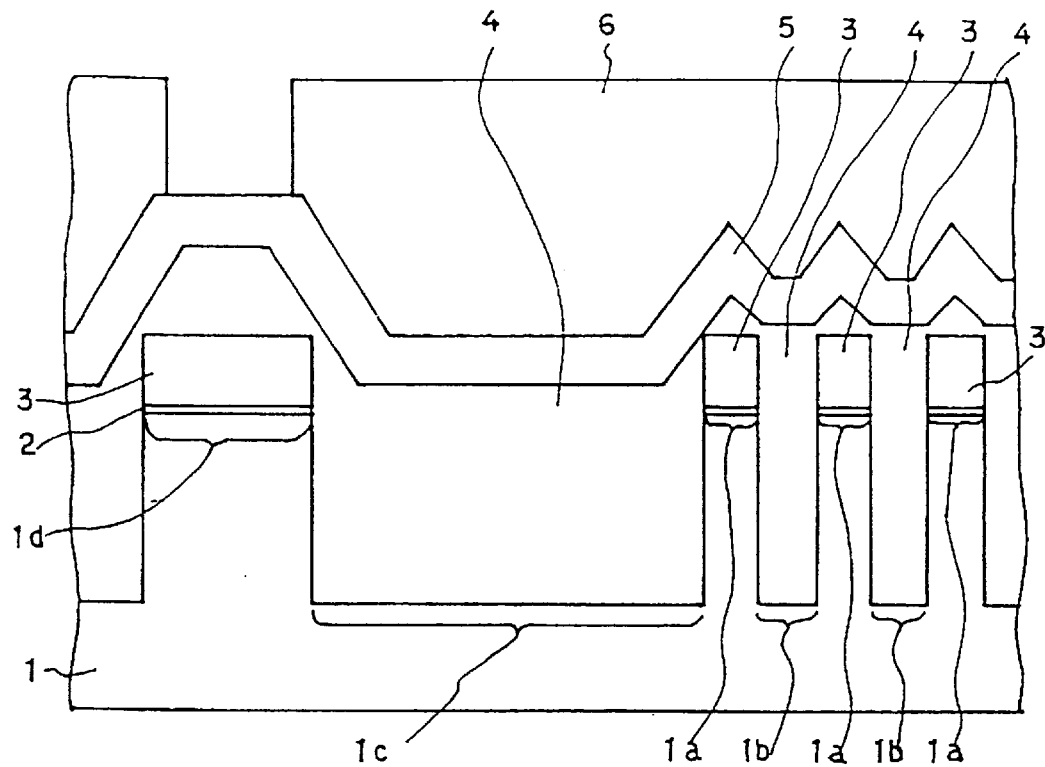
Figure 1:
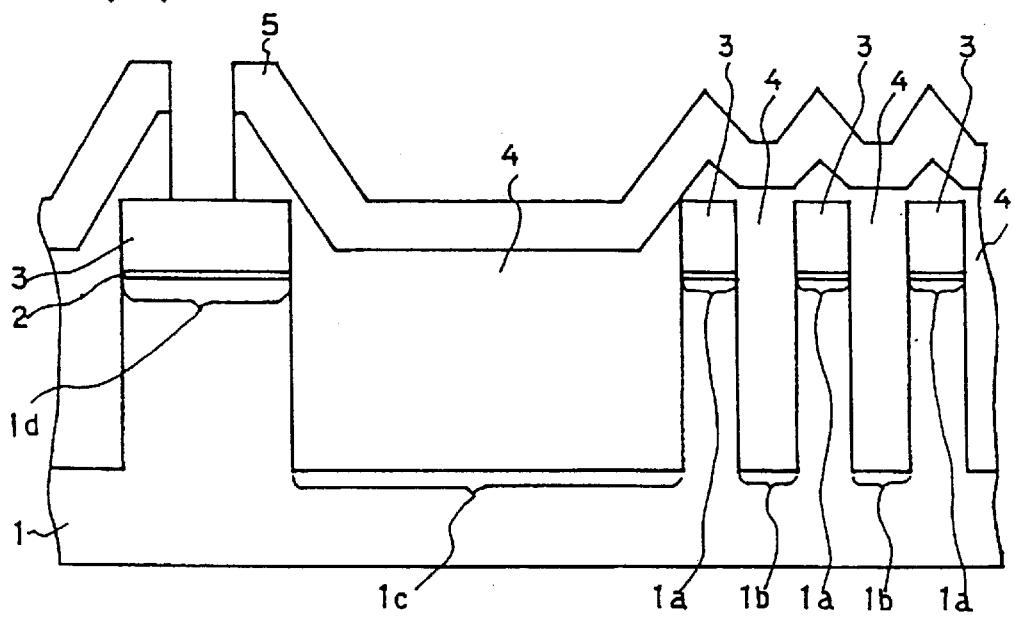
Figure 1:
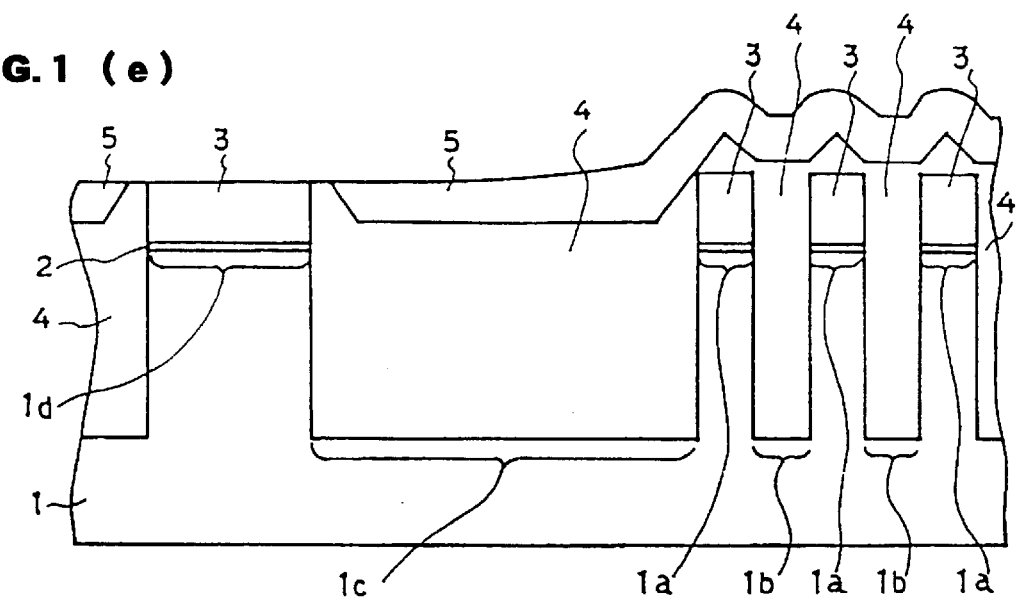
Figure 1:
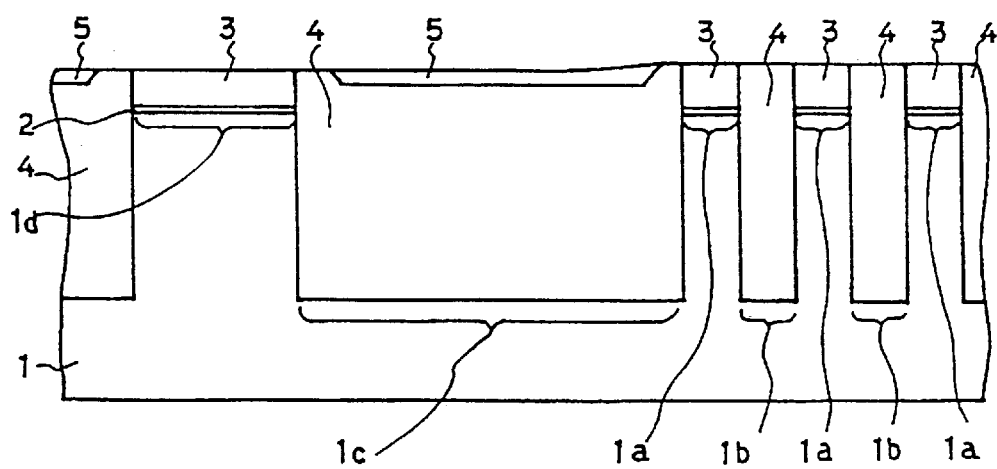
Figure 1:
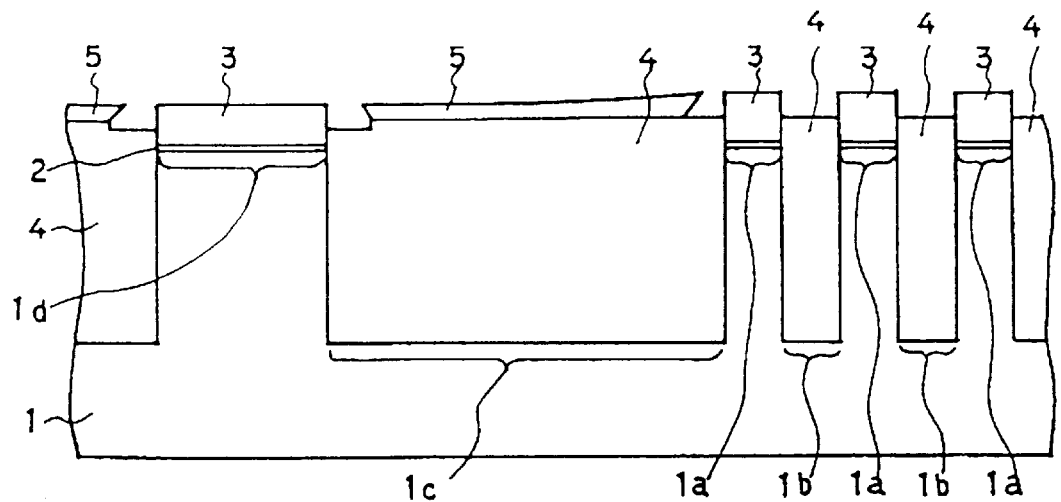
Figure 1:
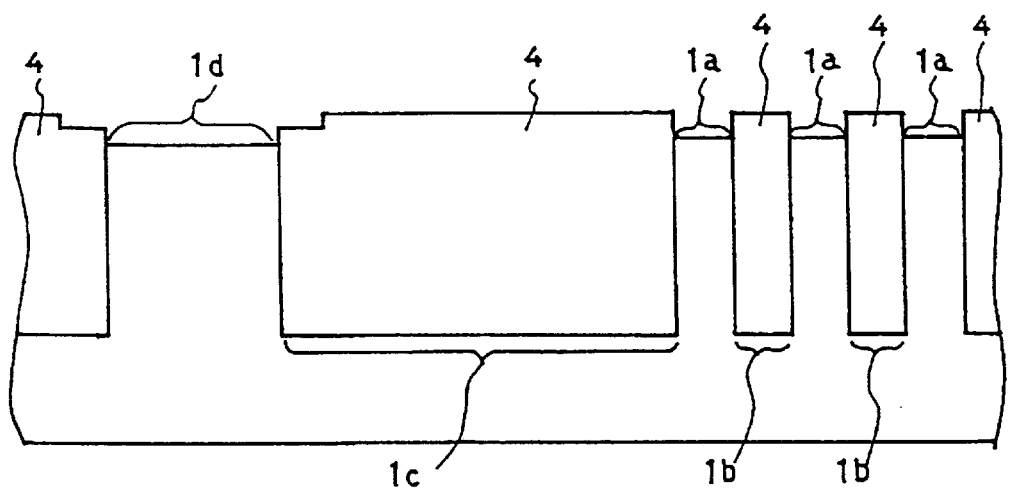

In the process for manufacturing a semiconductor structure of the present invention, a first silicon nitride film is formed on a semiconductor substrate in step (a).

The semiconductor substrate used in the present invention is not specifically restricted; it may be any substrate that is commonly used for semiconductor devices. It may be one which is made of a semiconductor (such as silicon or germanium) or a compound semiconductor (such as GaAs or InGaAs). A silicon substrate is desirable. This substrate may have elements (such as transistors, capacitors and resistors), wiring layers and insulating films formed thereon, individually or in combination with one another.

The first silicon nitride film may be formed by any known method, for example, by a CVD method. The thickness of the first silicon nitride film is not specifically restricted so long as it is large enough to prevent the surface of the semiconductor substrate from being oxidized during thermal treatment. For example, it is within the range of about 500 Å to about 3,000 Å.

Incidentally, it is preferable to form an oxidized film, more preferably a silicon oxide film, on the surface of the semiconductor substrate before the first silicon nitride film if formed. This oxidized film is suitably about 70 Å to 200 Å thick, for example. The oxidized film may be formed by a known method, for example, by a CVD method, a thermal oxidation method or the like.

In step (b), the silicon nitride film is patterned into a predetermined configuration. The semiconductor substrate is etched using the patterned silicon nitride film as a mask to form a plurality of first trenches and at least one second trench.

As a method of patterning the silicon nitride film into the predetermined configuration, a photolithography and etching process may be mentioned. A photoresist film used for this patterning may be used as a mask together with the patterned silicon nitride film without being removed. Alternatively the photoresist film may be removed and only the patterned silicon nitride film may be used as a mask.

As a method of etching the semiconductor substrate, may be mentioned dry etching using a RIE method, wet etching using a desired acid or alkali etchant or the like. How deep the semiconductor substrate is etched (i.e., the depth of the trenches) is not particularly limited, and may be about 2,000 Å to about 5,000 Å, for example. Preferably the first trenches and the second trench have the same depth, but may be formed in different depths. The width of the first trenches may be about 0.1 $\mu$m to about 1.0 $\mu$m and that of the second trenches may be about 1 mm to about 5 mm.

By the above-described steps, a first islands group and at least one second island-like region are formed on the semiconductor substrate. The first islands group comprises of a plurality of first island-like regions located between the plural first trenches, and the second island-like region is adjacent to the first islands group with intervention of the second trench and is wider than the first island-like region. Here, the width of the island-like regions is not particularly limited. For example, the first island-like region may be about 0.1 $\mu$m to about 0.6 $\mu$m wide and the second island-like region may be about 0.2 $\mu$m to about 5 mm wide. The number of first island-like regions in the first islands group is not limited, but may be about three to twenty, about three to ten, for example. The number of second island-like region is not limited either, but may be about ten or smaller, about one to five, one, for example.

In step (c), a silicon oxide film is deposited on the entire surface of the semiconductor substrate including the first and second trench so that the first and second trenches are embedded with the silicon oxide film. The silicon oxide film may be formed by a CVD method, for example. The thickness of the silicon oxide film is required to be as large as or larger than the depth of the first and second trenches. Preferably the silicon oxide film has a sufficiently larger thickness than the depth of the first and second trenches. For example, so long as the depth of the trenches is within the above-mentioned ranges, the silicon oxide film may be about 2,000 Å to about 8,000 Å thick.

In step (d), the second silicon nitride film is formed on the entire surface of the silicon oxide film. This silicon nitride film may be formed as described above. Preferably, the second silicon nitride film is thinner than that of the first silicon nitride film, and may be about 200 Å to about 2,900 Å, for example. Preferably, the second silicon nitride film is so formed that the surface of the second silicon film formed on a flat region on the second trench is substantially on the same plane with the surface of the first silicon nitride film on a flattened region on the first trench. Thereby, it becomes possible to polish the surfaces uniformly by a CMP method in a later step.

In step (e), the second silicon nitride film and the silicon oxide film are polished by a CMP method using a first slurry until the surface of the first silicon nitride film in the second island-like region is exposed. Here, the first slurry is not particularly limited, and may be any kind of slurry that is commonly used as an abrasive material in semiconductor processing. Among such slurries, a silicon compound-containing slurry (specifically, silica, silicon carbide or the like) may be mentioned. The particle diameter of abrasives contained in the slurry may be about 50 nm to about 200 nm, for example. Polishing conditions by the CMP method are not particularly limited. For example, the flow rate of the slurry may be about 1,000 sccm to about 5,000 sccm, a pressure of about 100 gF/cm$^2$ to about 500 gF/cm$^2$ may be applied, and the rotation speed may be about 4 rpm to about 20 rpm.

In the present invention, it is preferable that, before step (e), the second silicon nitride film and the silicon oxide film on the second island-like region (preferably on the flat region of the second island-like region) are etched using a mask until the surface of the first silicon nitrate film is exposed, thereby to form an opening on the second island-like region. Here, the formation of the mask and the etching of the second silicon nitride film and the silicon oxide film may be performed by ordinary methods in semiconductor processing, for example, by a photolithography and a dry etching processes.

In step (f), the second silicon nitride film and the silicon oxide film are polished by a CMP method using a second slurry until the surface of the first silicon nitride film on the first island-like region is exposed. Here, the second slurry is not particularly limited and may be any kind of slurry that is commonly used as an abrasive material in semiconductor processing. Among such slurries, it is preferable to use a slurry which provides a selective ratio of about 150 or more for the silicon oxide film to the silicon nitride film. For example, a cerium compound-containing slurry (specifically, cerium oxide or the like) may be mentioned. By using such a slurry, the silicon oxide film can be selectively polished while the polishing of the silicon nitride film is suppressed. The particle diameter of abrasive material contained in the slurry for the silicon nitride film may be about 100 nm to about 300 nm, for example. Polishing conditions by the CMP method are not particularly limited. For example, the flow rate of the slurry may be about 1,000 sccm to about 5,000 sccm, a pressure of about 100 gF/cm$^2$ to about 500 gF/cm$^2$ may be applied, and the rotation speed may be about 4 rpm to about 20 rpm.

In step (g), the silicon oxide film is etched in a predetermined amount. Here the etching of the silicon oxide film may be performed by any etching method that is not particularly limited. For example, wet etching using a HF-containing etchant may be mentioned. The etch amount at this time is not particularly limited provided that level difference (ups and downs) on the surface can be reduced, and for example, may be about 5% to about 20% of the depth of the trenches, for example, about 100 Å to about 1,000 Å.

In step (h), the second and first silicon nitride films are removed. Here the removal method is not particularly limited, but preferred is a method which provides a large selective ratio for the silicon nitride film to the silicon oxide film. For example, may be mentioned a wet etching with use of heated phosphoric acid as an etchant.

The process for manufacturing a semiconductor structure of the present invention is now described in detail by way of example thereof with reference to FIGS. 1(a) to 1(h).

First, a pad oxidized film 2 is formed to a thickness of 140 Å on a silicon substrate 1 by thermal oxidation, and a first silicon nitride film 3 of 1,600 Å thickness is formed thereon (FIG. 1(a)). This first silicon nitride film 3 is for preventing oxidation of a surface of the silicon substrate 1 which will be an active region during thermal treatment in a later step.

Subsequently, for the formation of device isolation regions, resist is applied, exposed and developed. Next, the silicon nitride film 3 and the pad oxidized film 2 in the device isolation regions-to be are etched at gas flow rates of 10 sccm, 22 sccm and 8 sccm for $CHF_3$, $CF_4$ and $O_2$, respectively. Thereafter, the silicon substrate 1 is etched, thereby to form a plurality of trenches of 3,500 Å depth (FIG. 1(b)). In this embodiment, formed are a first region including a plurality of first island-like regions 1a which will be active regions and a plurality of first trenches 1b which will be device isolation regions, a second trench region 1c which is provided adjacently to the first island-like region 1a at an end of the aforesaid first region, has a larger width than the first trench region 1b and will be a device isolation region, and a second island-like region 1d surrounded by the second trench region 1c which will be an active region. In this embodiment, the first island-like region 1a is 0.22 82 m to 0.4 μm wide, the first trench region 1b is 0.28 μm to 0.7 m wide, the second island-like region 1d is wider than the first island-like region 1a, and the second trench 1c is 2 to 4 mm wide.

Next, the resist is ashed and washed away, and then oxide films are buried in the first trenches 1b and the second trench 1c. At this time, the buried oxide film 4 in the second trench 1c is required to be formed to such a thickness that the top surface of the buried oxide film 4 is as high as or higher than the first island-like regions 1a of the silicon substrate. For this purpose, the buried oxide film 4 is formed to have a thickness of 3,500 Å to 5,000 Å, for example, 4,000 Å.

Subsequently, a second silicon nitride film 5 is formed to a thickness of 1,000 Å. It is desirable for uniform surface polish in a later step that the surface of the second silicon nitride film 5 on a flat portion on the second trench 1c is on the same level with the surface of the first silicon nitride film 3 on the second island-like region 1d. That is, it is desirable that the first silicon nitride film 3 is formed to have a larger thickness than the second silicon nitride film 5.

Next, a resist pattern 6 is formed in a predetermined configuration by applying, exposing and developing resist (FIG. 1(c)). Thereafter, the silicon nitride film 5 and the buried oxide films 4 on the second island-like region are etched to expose the surface of the first silicon nitride film 3 on the second island-like region 1d (FIG. 1(d)). At this time, it is desirable to etch a portion on the second island-like region 1d where the second silicon nitride film 5 is flat. In a peripheral region of the second island-like region 1d, since the buried oxide film 4d changes its thickness, there arises a problem in that the amount of over-etching increases toward outer edges of the second island-like region 1d. The formation of an opening with use of the resist pattern in the predetermined configuration is required, for example, in the cases where the second island-like region 1d has a width of 1.15 μm or more. This is because, the formation of the opening should be avoided in both side portions of 0.3 μm in width of the second island-like region 1d since the thickness of the oxide film is not uniform there and because the minimum producible size of the opening is 0.55 μm.

Next, polishing by the first CMP method is conducted under polishing conditions of using a fumed silica slurry of pH 10.3 in a concentration of 12 wt % containing $SiO_2$ whose particle diameter is 50 nm to 200 nm, a pressure of 350 gF/$cm^2$, a rotation speed of 50 rpm for a polishing disk, a rotation speed of 6.9 rpm for a lap disk on a wafer side and a slurry flow rate of 2,000 sccm, until the entire top surface of the first silicon nitride 3 on the second island-like region 1d is exposed. In this embodiment, polishing of 2,500 Å (the amount of polishing a laminate of the silicon nitride film and the silicon oxide film calculated in terms of a single layer of silicon oxide) is performed (FIG. 1(e)). By this polishing, achieved is such flatness that a first level difference defined by the surface of the first silicon nitride film 3 on the second island-like region 1d and the surface of the second silicon nitride film 5 on the second trench 1c is 200 Å or less and a second level difference defined by the surface of the second silicon nitride film 5 on the first island-like region 1a and the surface of the second silicon nitride film 5 on the first island-like region 1a and the surface of the second silicon nitride film 5 on the first trench 1b is about 1,000 Å. The slurry used for this first CMP method has a stronger mechanical polishing action than a chemical polishing action and has a great effect in eliminating level difference.

At this time, the remaining second silicon nitride film as a polish stop film in the second trench 1c is 500 Å to 900 Å thick and the remaining first silicon nitride film 3 in the second island-like region 1d is 1,000 Å to 1,300 Å thick.

Next, polishing by the second CMP method is conducted using a cerium oxide slurry, which is a cerium-containing slurry, of pH 6 to 6.25 having a particle diameter of 250 nm and a selective ratio of 150 or more for the silicon oxide film with respect to the silicon nitride film, until the top surface of the first silicon nitride film 3 on the first island-like region 1a is exposed. In this embodiment, polishing of 4,000 Å to 6,000 Å (the amount of polishing a laminate of the silicon nitride film and the silicon oxide film calculated in terms of a single layer of silicon oxide ) is performed (FIG. 1(f)). Polishing conditions are the same as used for the first polishing. By this polishing, the above-mentioned first and second level differences becomes 200 Å or smaller.

At this time, the second silicon nitride film 5 remains in a thickness of 400 Å to 600 Å on the second trench 1c, in a thickness of 750 Å to 800 Å on the second island-like region 1d, and in a thickness of 900 Å to 1,000 Å on the first island-like region. Afterward, the buried oxide film near the island-like regions is etched about 400 Å by wet etching with an etchant containing HF so as to reduce level difference for later steps (FIG. 1(g)).

Subsequently, the first silicon nitride films 3 on the first and second island-like regions 1a and 1b are removed using heated phosphoric acid (FIG. 1(h)).

As explained above, by use of the present invention, it is possible to flatten the surface of the substrate without reducing the oxide films in the device isolation regions of trench structure. Therefore, it is possible to prevent deterioration of device characteristics due to dishing.

What is claimed is:

1. A process for manufacturing a semiconductor structure comprising the steps of:

(a) forming a first silicon nitride film on a semiconductor substrate;

(b) patterning the first silicon nitride film into a predetermined configuration, etching the resulting semiconductor substrate using the first silicon nitride film as a mast to form a plurality of first trenches and at least one second trench, so as to form a first islands group and at least one second island-like region, the first islands group being composed of plural first island-like regions located between the plural first trenches, and the second island-like region being adjacent to the first islands group and separated by the second trench and being wider than the first island-like regions;

(c) depositing a silicon oxide film over the resulting surface to fill the first and second trenches with the silicon oxide film;

(d) forming a second silicon nitride film over the resulting surface;

(e) polishing the second silicon nitride film and the silicon oxide film by a CMP method using a first slurry until the first surface of the first silicon nitride film on the second island-like region is exposed;

(f) polishing the second silicon nitride film and the silicon oxide film by a CMP method using a second slurry until the surface of the first silicon nitride film on the first island-like region is exposed, wherein the first slurry is different form the second slurry;

(g) etching a predetermined amount of the silicon oxide film; and (h) removing the second silicon nitride film and the first silicon nitride film.

2. A process for manufacturing a semiconductor structure according to claim 1, wherein the second silicon nitride film is formed so that the surface of the second silicon nitride film on a flat region on the second trench is on the same plane with the surface of the first silicon nitride film on a flattened region on the first trench.

3. A process for manufacturing a semiconductor structure according to claim 1, wherein the second silicon nitride film is formed so that the thickness of the second silicon nitride film is smaller than that of the first silicon nitride film.

4. A process for manufacturing a semiconductor structure according to any one of claims 1, wherein, before the step (e), the second silicon nitride film and the silicon oxide film on the second island-like region is etched using a mask until a surface of the first silicon nitride film is exposed, thereby to form an opening on the second island-like region.

5. A process for manufacturing a semiconductor structure according to any one of claim 1, wherein a silicon compound-containing slurry is used as the first slurry and a cerium compound-containing slurry is used as the second slurry.

* * * * *